United States Patent [19]

Cass et al.

[11] 3,795,845

[45] Mar. 5, 1974

[54] SEMICONDUCTOR CHIP HAVING CONNECTING PADS ARRANGED IN A NON-ORTHOGONAL ARRAY

[75] Inventors: Eugene E. Cass, Hopewell Junction; Robert M. Gustafson, Poughkeepsie; Paul M. Young, Pleasant Valley, all of N.Y.

[73] Assignee: International Business Machines Corporation, Armonk, N.Y.

[22] Filed: Dec. 26, 1972

[21] Appl. No.: 317,902

[52] U.S. Cl. ...... 317/234 R, 317/234 H, 317/234 J, 317/234 N, 29/589

[51] Int. Cl. .......... H01l 3/00, H01l 5/00

[58] Field of Search .......... 317/234, 4, 4.1, 5, 5.4; 174/525; 29/589

[56] References Cited

UNITED STATES PATENTS 3,466,467 9/1969 Houcke et al. .......... 307/315 X 3,476,992 11/1969 Chu .......... 317/235 AB

OTHER PUBLICATIONS

TCA Technical Notes, by Balents, Feb. 11, 1970 TN NO: 857.

IBM Technical Disclosure Bulletin, by Blodgett, Vol. 13, No. 3, August 1970.

IBM Technical Bulletin, by Oafrate, Vol. 15, No. 4, Sept. 1972.

*Primary Examiner*—Andrew J. James
*Attorney, Agent, or Firm*—Frank C. Leach, Jr.; George O. Saile

[57] ABSTRACT

A semiconductor chip has its pads, which connect circuits on the chip to electrically conductive elements on a support substrate and form the structural connection between the chip and the substrate, arranged in a plurality of concentric circles with the pads in each circle being equally angularly spaced from each other.

8 Claims, 2 Drawing Figures

SEMICONDUCTOR CHIP HAVING CONNECTING PADS ARRANGED IN A NON-ORTHOGONAL ARRAY

A single semiconductor chip of extremely small size can have a relatively large number of integrated circuits formed thereon. Each of these circuits must be electrically connected to other electrical elements such as integrated circuits on other chips and power supply lines, for example, Additionally, each of the chips must be supported on a substrate.

Accordingly, pads of metal are formed extending through an insulating surface of the semiconductor chip with each pad capable of being electrically connected to one or more of the integrated circuits of the chip. The pads also structurally connect the chip to the substrate on which a single chip or plurality of the chips is supported.

The structural connection by the pad of the chip to the substrate is by the pad being joined to an electrically conductive element on the substrate so that the pad is electrically connected thereto. Thus, the connections of the circuits on the chip to other electrical devices occur through the electrically conductive elements on the substrate.

The pads of metal not only serve to electrically connect the circuits to other electrical elements but also to enable testing of the circuits on the chip prior to the connection of the pads to the electrically conductive elements on the substrate. This testing of the circuits of the chip prior to the connection of the chip to the substrate permits determination of whether the circuits on the chip function in the required manner.

This testing is accomplished by having a probe make ohmic contact with each of the pads. Each of the probes can selectively supply either a fixed voltage or current to the pad with which it has ohmic contact. The current or voltage resulting from the fixed voltage or current, respectively, is measured to determine if the circuit connected to the pad functions satisfactorily. It should be understood that all of the circuits do not have a current or voltage applied thereto at the same time and that the fixed current or voltage may be of different magnitudes.

The pads have previously been mounted around the periphery of the chip in an orthogonal arrangement. Thus, any change in the size of the chip has altered the location of the pads so that a new probe tool has been required to enable a probe to contact each of the pads to permit testing of the circuits on the chip. Likewise, changes in the circuits used on a particular size chip also have resulted at times in the pads having to be relocated on the chip. This also has required a new probe tool.

Additionally, with the pads arranged in an orthogonal manner, the required angular spacing between the probes has limited the number of pads that could be effectively mounted on a chip of a particular size. Accordingly, even though more circuits might be employed on a chip of a particular size, the arrangement of the pads around the periphery of the chip has limited the number of pads so that the number of circuits on a chip of a particular size also could be limited.

Since a typical use of a module formed by a plurality of chips on a substrate has been in a machine such as a computer, for example, the significant temperature changes between the on and off states of the computer and the difference in the thermal coefficients of expansion between the chip and the substrate has created a shear stress on the pads, which connect each of the chips to the substrate. This shear stress, which is a thermal stress, on each of the pads depends on the distance of the pad from the center of the chip since the center of the chip is the neutral point of thermal expansion between the chip and the substrate.

With the pads arranged on the chip in an orthogonal array about the periphery of the chip, the pads located at the corners of the array farthest from the center of the chip have been subjected to the maximum stress. Thus, the maximum size of the chip has been determined by the shear stress which the pad at each of the corners of the orthogonal array of pads is capable of withstanding without fracture.

The fracture of a pad, which is due to fatigue caused by thermal cycling of the computer, can disable the computer. Accordingly, it has been necessary to limit the size of the chip in accordance with the maximum shear stress that the pads, which connect the chip to the substrate, are capable of withstanding without fracture.

Thus, this shear stress problem of the pads has limited the maximum size of the chip. In conjunction with the number of pads arranged around the periphery of the chip being limited because of the necessary probe connections to the pads during testing of the circuits on the chip, maximum utilization of the area of a chip has not been obtained in many instances.

The present invention satisfactorily solves the foregoing problems by providing pads on a chip in which the pads are arranged in a non-orthogonal array to allow more pads to be disposed on a chip whereby more effective utilization of the area of the chip is obtained. Furthermore, by disposing the pads in one or more concentric circles to form the non-orthogonal pad array of the present invention, all of the pads forming the circle of the maximum diameter have the same maximum shear stress. As a result, a chip may be substantially larger in size when using the pad array of the present invention without having any of the pads subjected to any greater shear stress than would be produced in an orthogonal pad array in which the pads at the corners of the array were located the same distance from the center of the chip as the radius of the maximum circle of pads in the concentric circular array.

As an example, a chip can have its size increased from a square of 150 mils to a square of 220 mils without increasing the maximum shear stress on any connecting pad. With the square shaped chip of 150 mils, the pad at each of the corners of the chip is located 99 mils from the center of the chip. This is because the diagonal between opposite corners of the orthogonal pad array on a square shaped chip of 150 mils is 198 mils ($140 \times 1.414$) so that the distance of either end of the diagonal from the center of the chip is 99 mils. Accordingly, any pad disposed on a circle having a radius of 99 mils with the center of the chip as its center would have the same shear stress on the pad as would the pad at each of the corners of a square shaped array of pads on the square shaped chip of 150 mils.

This permits the size of the chip to be increased so that a circle with a radius of 99 mils and the center of the chip as its center is within the square shaped chip. As a result, the square shaped chip could be increased in size from 150 mils to 220 mils without any increase in the shear stress on any pad connecting the chip to the substrate. Thus, a chip having a much larger area can be utilized without the connecting pads being subjected to any additional shear stress.

Furthermore, the number of pads on the chip can be more easily increased by disposing the pads in a circular array with the pads arranged in a plurality of concentric circles since this array enables the probes to make contact with the various pads without difficulty. Additionally, the pads are preferably equally angularly spaced on each of the circles although the spacing on each of the circles is not necessarily the same number of degrees.

With the pads arranged in concentric circles, it is not necessary to design a new probe tool for each change in the size of the chip, change in the number of circles of pads, or the radius of each circle. Instead, by utilizing a sufficient number of pads, the same concentric circular array of pads can be employed for chips of different sizes or chips with different numbers of circuits thereon; this allows the same probe tool to be employed for chips of various sizes and with circuits arranged in various manners on chips of the same or different sizes.

An object of this invention is to provide a semiconductor chip having its metallic connecting pads arranged in a non-orthogonal array.

Another object of this invention is to provide a semiconductor chip having its connecting pads arranged in a plurality of concentric circles.

A further object of this invention is to provide a semiconductor chip having its connecting pads arranged in an array so that the pads do not have to be changed for alterations in the number or location of circuits on the chip.

The foregoing and other objects, features, and advantages of the invention will be more apparent from the following more particular description of the preferred embodiment of the invention, as illustrated in the accompanying drawing.

Figure 1:
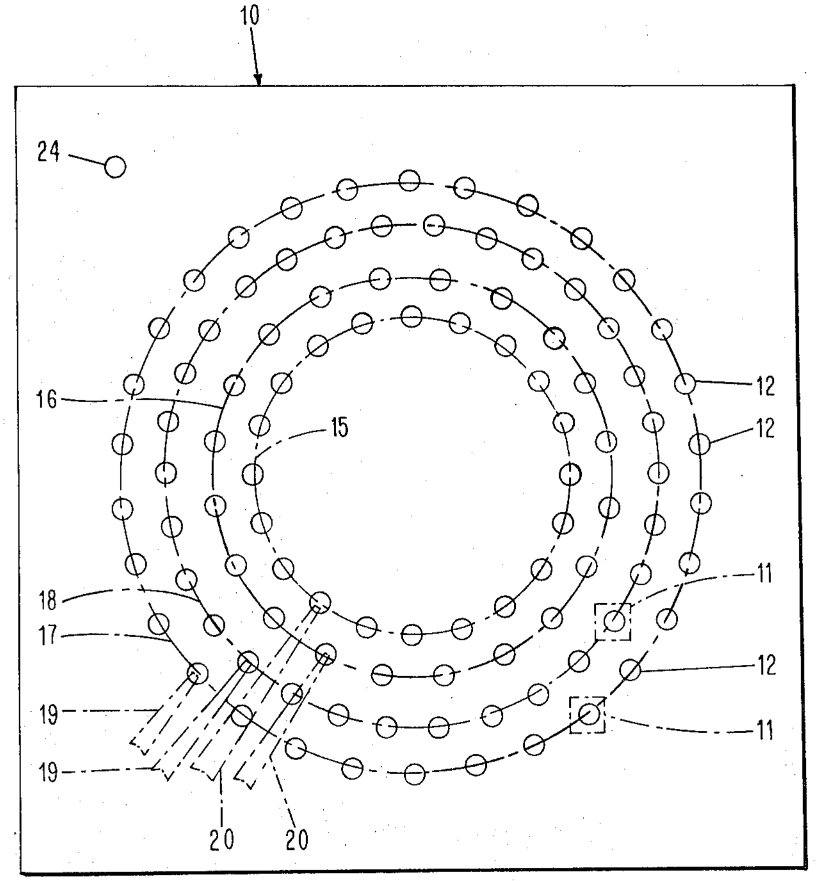
FIG. 1 is a schematic plan view of a semiconductor chip having its connecting pads arranged in the non-orthogonal array of the present invention.

Referring to the drawing and particularly FIG. 1, there is shown a semiconductor chip 10, which is square shaped. The chip 10, which has a substrate of silicon, for example, has a plurality of integrated circuits (some schematically shown in phantom at 11 in FIG. 1) thereon. Each of the circuits 11 is connected to one of a plurality of connecting pads 12, which are formed of metal, extending through an insulating surface 14, which may be quartz, for example, of the chip 10. Each of the circuits 11 is connected to a portion of a layer of metal, which is beneath the insulating surface 14, to which the connecting pad 12 is joined.

The pads 12 are arranged in a non-orthogonal array so as to form four concentric circles. There are twenty of the pads 12 forming an inner circle 15 and twenty of the pads 12 forming an intermediate circle 16, which is next to the inner circle 15. There are thirty of the pads 12 forming an outer circle 17 and thirty of the pads 12 forming an outer intermediate circle 18, which is between the outer circle 17 and the inner intermediate circle 16. Thus, there are one hundred of the pads 12 on the chip 10. It should be understood that the number of the pads 12 and their arrangement may vary as desired.

With twenty of the pads 12 in the inner circle 15, each of the pads 12 of the inner circle 15 is spaced 18° from the adjacent pads 12. Similarly, the pads 12 of the inner intermediate circle 16 are spaced 18° from each other. By disposing each of the pads 12 of the circle 16 on a radius, which is an equal angular distance from the radius to each of two adjacent of the pads 12 of the inner circle 15, there is an angle of 9° between the radius from the center of the chip 10 to one of the pads 12 of the inner circle 15 and the radius from the center of the chip 10 to the next adjacent of the pads 12 of the circle 16 so that there is equal angular spacing between the pads 12 of the adjacent circles as well as equal angular spacing of the pads 12 of each of the circles 15 and 16.

Since there are thirty of the pads 12 forming the outer circle 17, each of these pads is spaced 12° from the adjacent pads 12 of the circle 17. A similar arrangement exists for the pads 12 forming the outer intermediate circle 18.

By disposing each of the pads 12 of the outer circle 17 on a radius extending from the center of the chip 10 an equal angular distance from radii extending from the center of the chip 10 to two adjacent of the pads 12 of the circle 18, the spacing between one of the pads 12 of the outer circle 17 and one of the pads of the outer intermediate circle 18 is 6°. Thus, there is equal angular spacing between the pads 12 of the outer circle 17 and the pads of the outer intermediate circle 18 in addition to equal angular spacing between the pads 12 of each of the circles 17 and 18.

This arrangement of the pads 12 enables cantilevered probes 19 to engage each of the pads 12 of the two adjacent circles 17 and 18 and cantilevered probes 20 to engage each of the pads 12 of the two adjacent circles 15 and 16. The probes 20 are in a different plane than the probes 19 with the planes being parallel.

The probes 19 extend from one side of the support ring of the probe tool while the probes 20 extend from the other side of the support ring. By appropriate design of the diameters of the opposite sides of the support ring, the length of each of the probes 19 and 20 can be the same.

Figure 2:
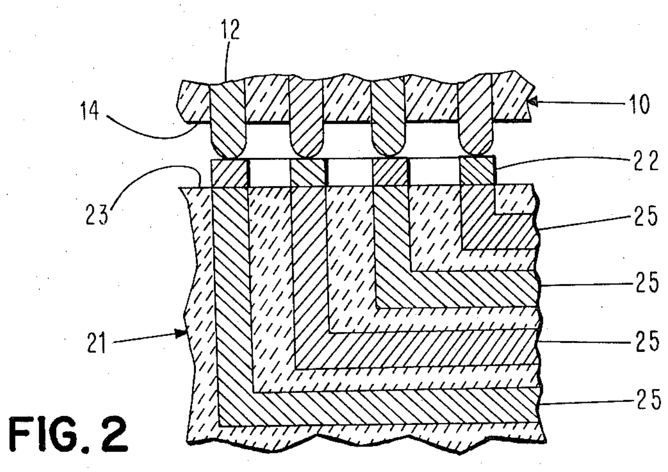
FIG. 2 is a fragmentary schematic sectional view of a portion of a chip and a portion of the substrate to which it is secured by the connecting pads.

The probes 19 and 20 are employed to test the various circuits 11 on the chip 10 for functionality prior to connecting the chip 10 to a substrate 21 (see FIG. 2). If the circuits 11 on the chip 10 are satisfactory, then the chip 10 is joined to the substrate 21, which is preferably formed of a suitable ceramic material such as alumina, for example, that functions as an insulating material.

The chip 10 is joined to the substrate 21 by the connecting pads 12, which may be lead-tin balls of solder, for example. The pads 12 are secured to metallic lands 22, which are formed to extend above upper surface 23 of the substrate 21. The lands 22 are arranged in the same configuration as the pads 12 so that each of the pads 12 will contact one of the lands 22. Thus, the lands 22 are arranged in four concentric circles.

Suitable alignment means including an orientation pad 24 (see FIG. 1) on the chip 10 are employed to insure that each of the pads 12 aligns with a corresponding one of the metallic lands 22. The joining of the pads 12 to the lands 22 may be by any of the well-known means for securing lead-tin balls to metallic elements on a substrate.

Each of the lands 22 is connected to a different and separate layer 25 of metal. Each of the layers 25 of metal is connected to suitable means such as pins, for example. The pins can connect various of the layers 25 of metal to each other whereby circuits of different chips are connected to each other. As shown in FIG. 2, portions of the layers 25 of metal for the four different concentric circles of the lands 22 are vertically spaced relative to each other. Thus, the substrate 21 would have thirty of the layers 25 of metal forming the uppermost plane of metal layers, thirty of the layers 25 of metal forming the plane below the uppermost plane, twenty of the layers 25 of metal forming the lowermost plane, and twenty of the layers 25 of metal forming the plane above the lowermost plane when the pads 12 are arranged in the four concentric circles 15–18 as previously described.

Accordingly, when the chip 10 has been joined to the substrate 21 by the connecting pads 12, the circuits 11 are electrically connected to the layers 25 of metal and the chip 10 is structurally connected to the substrate 21 through the pads 12. When the module, which includes the substrate 21 and a plurality of the chips 10 thereon, is disposed in a computer, for example, each of the pads 12 of the outer circle 17 is subjected to the same shear stress due to changes in the heat state of a machine such as a computer, for example, in which the module is mounted. Thus, there will be no fracturing of one of the pads 12 due to its being subjected to a greater shear stress than any of the other of the pads 12 of the circle 17.

Furthermore, the pads 12 of the circle 18 are subjected to a smaller shear stress than the pads 12 in the circle 17 because the pads 12 of the circle 18 are closer to the center of the chip 10. Similarly, there is less shear stress on each of the pads 12 of the circle 16 than on the pads 12 of the circle 18. The minimum shear stress on any of the pads 12 occurs on the pads 12 of the inner circle 15 since these pads 12 are closest to the center of the chip 10.

It should be understood that various of the pads 12 are utilized at all times to provide various voltage levels to the circuits 11 on the chip 10. The other of the pads 12 may be used to electrically connect one or more of the circuits 11 to one of the layers 25 of metal in the substrate 21 or may not be used for electrical connection depending on the number and type of circuits on the chip 10.

While the present invention has shown and described the pads as being arranged in a plurality of concentric circles, it should be understood that all of the pads 12 could be arranged in a single circle depending on the number of the pads 12 required for a particular chip. While the pads 12 have been shown as equally angularly spaced from each other in at least each of the circles 15–18, it should be understood that such is not necessary for satisfactory operation insofar as having the same shear stress on each of the connecting pads 12 but it is desirable for most effective use of the probe tool. It is only necessary that the pads 12 be the same distance from the center of the chip 10 so that the pads 12 are subjected to the same maximum shear stress.

While the pads 12 have been shown in a concentric circular array as the non-orthogonal array, it should be understood that any other arrangement in which a number of the pads 12 have substantially the same maximum shear stress could be employed. For example, the pads 12 could be arranged in an ellipse or a plurality of ellipses.

An advantage of this invention is that it enables a uniform probe tool to be employed with chips of various sizes and with chips having different numbers and types of circuits. Another advantage of this invention is that it is easier for the probes to contact interconnecting pads. A further advantage of this invention is that the area of a chip may be increased without requiring the connecting pads to withstand a shear stress greater than that required for a smaller area chip having an orthogonal array of connecting pads.

While the invention has been particularly shown and described with reference to a preferred embodiment thereof, it will be understood by those skilled in the art that various changes in form and detail may be made therein without departing from the spirit and scope of the invention.

What is claimed is:

1. A semiconductor chip having:

a plurality of integrated circuits;

a plurality of metallic pads extending beyond a surface thereof, each of said pads being adapted to be electrically connected to at least one of the circuits of said chip;

each of said pads being adapted to be fixedly secured to electrically conductive means on a substrate to fixedly secure said chip to the substrate to form an electrical connection between the electrically conductive means on the substrate and any circuit on said chip connected to said pad;

and said pads being arranged on said chip in a non-orthogonal array to cause at least a plurality of said pads to be subjected to substantially the same shear stress when fixedly secured to the electrically conductive means on the substrate.

2. The chip according to claim 1 in which said pads are arranged in a plurality of concentric circles to form the non-orthogonal array with the center of said chip forming the center of the circles, each of said pads in each of said circles being subjected to substantially the same shear stress when said pads are fixedly secured to the electrically conductive means on the pads.

3. The chip according to claim 2 in which said pads of each of the concentric circles are equally angularly spaced from each other.

4. The chip according to claim 1 in which said pads are arranged in four concentric circles to form the non-orthogonal array with the center of said chip being the center of the circles, each of said pads in each of said circles being subjected to substantially the same shear stress when said pads are fixedly secured to the electrically conductive means on the pads.

5. The chip according to claim 4 in which:

said pads of each of the two innermost circles are equally angularly spaced from each other;

each of said pads of one of the two innermost circles is disposed on a radius from the center of the chip that is an equal angular distance from the radii extending from the center of the chip on which the two adjacent pads of the other of the two innermost circles are disposed;

said pads of each of two outermost circles are equally angularly spaced from each other;

and each of said pads of one of the two outermost circles is disposed on a radius from the center of the chip that is an equal angular distance from the radii extending from the center of the chip on which the two adjacent pads of the other of the two outermost circles are disposed.

6. The chip according to claim 1 in which said pads are arranged on at least one circle to form the non-orthogonal array with the center of said chip forming the center of the circle.

7. The chip according to claim 6 in which said pads of any circle are equally angularly spaced from each other.

8. The chip according to claim 1 in which said pads are equally angularly spaced from each other.

* * * * *